(12) United States Patent
Huang et al.

(10) Patent No.: US 10,107,938 B2
(45) Date of Patent: Oct. 23, 2018

(54) MANAGING DISCONTINUITIES IN GEOLOGIC MODELS

(71) Applicants: Hao Huang, The Woodlands, TX (US); Xiaohui Wu, Sugar Land, TX (US); Larisa V. Branets, Conroe, TX (US); Dar-Lon Chang, Sugar Land, TX (US); Xiang Ma, Conroe, TX (US); Gauthier D. Becker, The Woodlands, TX (US); Thomas C. Halsey, West University Place, TX (US)

(72) Inventors: Hao Huang, The Woodlands, TX (US); Xiaohui Wu, Sugar Land, TX (US); Larisa V. Branets, Conroe, TX (US); Dar-Lon Chang, Sugar Land, TX (US); Xiang Ma, Conroe, TX (US); Gauthier D. Becker, The Woodlands, TX (US); Thomas C. Halsey, West University Place, TX (US)

(73) Assignee: ExxonMobil Upstream Research Company, Spring, TX (US)

(*) Notice: Subject to any disclaimer, the term of this patent is extended or adjusted under 35 U.S.C. 154(b) by 340 days.

(21) Appl. No.: 14/928,527

(22) Filed: Oct. 30, 2015

(65) Prior Publication Data

US 2016/0124117 A1    May 5, 2016

Related U.S. Application Data

(60) Provisional application No. 62/221,915, filed on Sep. 22, 2015, provisional application No. 62/073,465, (Continued)

(51) Int. Cl.
    *G06G 7/48* (2006.01)
    *G01V 99/00* (2009.01)
    (Continued)

(52) U.S. Cl.
    CPC ............ *G01V 99/005* (2013.01); *G06F 17/10* (2013.01); *G06T 17/05* (2013.01); *G01V 2210/66* (2013.01); *G06F 17/5009* (2013.01)

(58) Field of Classification Search
    CPC .. G01V 99/005; G01V 2210/66; G06T 17/05; G06F 17/10; G06F 17/5009
    (Continued)

(56) References Cited

U.S. PATENT DOCUMENTS 5,537,320 A    7/1996   Simpson et al.
5,706,194 A    1/1998   Neff et al.
               (Continued)

OTHER PUBLICATIONS

U.S. Appl. No. 14/868,562, filed Sep. 29, 2015, Branets, et al.
(Continued)

*Primary Examiner* — Vu A Vu
(74) *Attorney, Agent, or Firm* — ExxonMobil Upstream Research Company—Law Department

(57) ABSTRACT

A method and system are described for generating a geologic model having material properties for a faulted subsurface region. The method and system involve parameterizing corresponding fault surfaces and solving an energy optimization equation and/or conservation law equation for the corresponding fault surfaces based on parameterized nodes on the fault surfaces to generate a displacement map. The displacement map is used to map a geologic model from the physical space to the design space, where it is populated with material properties. The resulting populated geologic model may be used for hydrocarbon operations associated with the subsurface region.

21 Claims, 7 Drawing Sheets

Related U.S. Application Data filed on Oct. 31, 2014, provisional application No. 62/081,159, filed on Nov. 18, 2014.

(51) Int. Cl.
  G06F 17/10 (2006.01)
  G06T 17/05 (2011.01)
  G06F 17/50 (2006.01)

(58) Field of Classification Search
  USPC .......................................................... 703/10
  See application file for complete search history.

(56) References Cited

U.S. PATENT DOCUMENTS

| | | | |
|---|---|---|---|
| 5,844,799 A | 12/1998 | Joseph et al. | |
| 5,953,680 A | 9/1999 | Divies et al. | |
| 6,014,343 A | 1/2000 | Graf et al. | |
| 6,018,498 A | 1/2000 | Neff et al. | |
| 6,106,561 A | 8/2000 | Farmer | |
| 6,128,577 A | 10/2000 | Assa et al. | |
| 6,138,076 A | 10/2000 | Graf et al. | |
| 6,370,491 B1 | 4/2002 | Malthe-Sorenssen et al. | |
| 6,374,185 B1 | 4/2002 | Taner et al. | |
| 6,549,854 B1 | 4/2003 | Malinverno et al. | |
| 6,597,995 B1 | 7/2003 | Cornu et al. | |
| 6,980,940 B1 | 12/2005 | Gurpinar et al. | |
| 7,031,891 B2 | 4/2006 | Malthe-Sorenssen et al. | |
| 7,043,367 B2 | 5/2006 | Granjeon | |
| 7,043,410 B2 | 5/2006 | Malthe-Sorenssen et al. | |
| 7,069,149 B2 | 6/2006 | Goff et al. | |
| 7,089,166 B2 | 8/2006 | Malthe-Sorenssen et al. | |
| 7,254,091 B1 | 8/2007 | Gunning et al. | |
| 7,363,163 B2 | 4/2008 | Valec-Dupin et al. | |
| 7,424,415 B2 | 9/2008 | Vassiley | |
| 7,433,786 B2 | 10/2008 | Adams | |
| 7,451,066 B2 | 11/2008 | Edwards et al. | |
| 7,478,024 B2 | 1/2009 | Gurpinar et al. | |
| 7,480,205 B2 | 1/2009 | Wei | |
| 7,523,024 B2 | 4/2009 | Endres et al. | |
| 7,542,037 B2 | 6/2009 | Fremming | |
| 7,596,056 B2 | 9/2009 | Keskes et al. | |
| 7,596,481 B2 | 9/2009 | Zamora et al. | |
| 7,706,981 B2 | 4/2010 | Wilkinson et al. | |
| 7,711,532 B2 | 5/2010 | Dulac et al. | |
| 7,739,089 B2 | 6/2010 | Gurpinar et al. | |
| 7,756,694 B2 | 7/2010 | Graf et al. | |
| 7,796,469 B2 | 9/2010 | Keskes et al. | |
| 7,933,750 B2 | 4/2011 | Morton et al. | |
| 7,953,585 B2 | 5/2011 | Gurpinar et al. | |
| 7,986,319 B2 | 7/2011 | Dommisse | |
| 8,234,073 B2 | 7/2012 | Pyrcz et al. | |
| 8,255,195 B2 | 8/2012 | Yogeswaren | |
| 8,315,845 B2 | 11/2012 | Lepage | |
| 8,355,898 B2 | 1/2013 | Pyrcz et al. | |
| 8,374,836 B2 | 2/2013 | Yogeswaren | |
| 8,447,522 B2 | 5/2013 | Brooks | |
| 8,447,525 B2 | 5/2013 | Pepper | |
| 8,452,580 B2 | 5/2013 | Strebelle | |
| 8,457,940 B2 | 6/2013 | Xi et al. | |
| 8,463,586 B2 | 6/2013 | Mezghani et al. | |
| 8,515,678 B2 | 8/2013 | Pepper et al. | |
| 8,515,720 B2 | 8/2013 | Koutsabeloulis et al. | |
| 8,577,660 B2 | 11/2013 | Wendt et al. | |
| 8,594,986 B2 | 11/2013 | Lunati | |
| 8,599,643 B2 | 12/2013 | Pepper et al. | |
| 8,606,555 B2 | 12/2013 | Pyrcz et al. | |
| 8,639,444 B2 | 1/2014 | Pepper et al. | |
| 8,655,632 B2 | 2/2014 | Moguchaya | |
| 8,674,984 B2 | 3/2014 | Ran et al. | |
| 8,694,261 B1 | 4/2014 | Robinson | |
| 8,711,140 B1 | 4/2014 | Mallet | |
| 8,731,887 B2 | 5/2014 | Hilliard et al. | |
| 8,731,891 B2 | 5/2014 | Sung et al. | |
| 8,775,142 B2 | 7/2014 | Liu et al. | |
| 8,798,974 B1 | 8/2014 | Nunns | |
| 8,818,778 B2 | 8/2014 | Salazar-Tio et al. | |
| 8,843,353 B2 | 9/2014 | Posamentier et al. | |
| 8,922,558 B2 | 12/2014 | Page et al. | |
| 8,935,141 B2 | 1/2015 | Ran et al. | |
| 9,097,821 B2 | 8/2015 | Skalinski et al. | |
| 9,229,130 B1 | 1/2016 | Mallet | |
| 2006/0122780 A1 | 6/2006 | Cohen et al. | |
| 2006/0269139 A1 | 11/2006 | Keskes et al. | |
| 2011/0115787 A1 | 5/2011 | Kadlec | |
| 2011/0310101 A1 | 12/2011 | Prange et al. | |
| 2012/0221302 A1* | 8/2012 | Lewandowski | G01V 11/00 703/2 |
| 2013/0030782 A1 | 1/2013 | Yogeswaren | |
| 2013/0046524 A1 | 2/2013 | Gathogo et al. | |
| 2013/0073268 A1 | 3/2013 | Abacioglu et al. | |
| 2013/0083973 A1* | 4/2013 | Guillon | G01V 1/301 382/109 |
| 2013/0110484 A1 | 5/2013 | Hu et al. | |
| 2013/0124161 A1 | 5/2013 | Poudret et al. | |
| 2013/0138412 A1 | 5/2013 | Shi et al. | |
| 2013/0218539 A1* | 8/2013 | Souche | G06F 17/5009 703/2 |
| 2013/0246031 A1 | 9/2013 | Wu et al. | |
| 2013/0289962 A1 | 10/2013 | Wendt et al. | |
| 2013/0332125 A1 | 12/2013 | Suter et al. | |
| 2014/0136158 A1 | 5/2014 | Hegazy et al. | |
| 2014/0136171 A1 | 5/2014 | Sword, Jr. et al. | |
| 2014/0278298 A1 | 9/2014 | Maerten | |
| 2015/0106018 A1 | 4/2015 | Robinson | |

OTHER PUBLICATIONS

U.S. Appl. No. 14/868,548, filed Sep. 29, 2015, Bi, et al.
U.S. Appl. No. 14/807,748, filed Jul. 23, 2015, Branets, et al.
U.S. Appl. No. 14/749,756, filed Jun. 25, 2015, Casey.
Aarnes, J., (2004), "Multiscale simulation of flow in heterogeneous oil-reservoirs", SINTEF ICT, Dept. of Applied Mathematics, 2 pgs.
Aarnes, J., et al., (2004), "Toward reservoir simulation on geological grid models", $9^{th}$ European Conf. on the Mathematics of Oil Recovery, 8 pgs.
Ahmadizadeh, M., et al., (2007), "Combined Implicit or Explicit Integration Steps for Hybrid Simulation", *Structural Engineering Research Frontiers*, pp. 1-16.
Bortoli, L. J., et al., (1992), "Constraining Stochastic Images to Seismic Data", Geostatistics, Troia, *Quantitative Geology and Geostatistics* 1, pp. 325-338.
Byer, T.J., et al., (1998), "Preconditioned Newton Methods for Fully Coupled Reservoir and Surface Facility Models", *SPE 49001, 1998 SPE Annual Tech. Conf., and Exh.*, pp. 181-188.
Candes, E. J., et al., (2004), "New Tight Frames of Curvelets and Optimal Representations of Objects with $C^2$ Singularities," *Communications on Pure and Applied Mathematics* 57, pp. 219-266.
Chen, Y., et al., (2003), "A coupled local-global upscaling approach for simulating flow in highly heterogeneous formations", *Advances in Water Resources* 26, pp. 1041-1060.
Connolly, P., (1999), "Elastic Impedance," *The Leading Edge* 18, pp. 438-452.
Crotti, M.A., (2003), "Upscaling of Relative Permeability Curves for Reservoir Simulation: An Extension to Areal Simulations Based on Realistic Average Water Saturations", SPE 81038, SPE Latin American and Caribbean Petroleum Engineering Conf., 6 pgs.
Donoho, D. L., et al., (2002), "Beamlets and Multiscale Image Analysis," *Multiscale and Multiresolution Methods, Lecture Notes in Computational Science and Engineering* 20, pp. 149-196.
Durlofsky, L.J., (1991), "Numerical Calculation of Equivalent Grid Block Permeability Tensors for Heterogeneous Porous Media", *Water Resources Research* 27(5), pp. 699-708.
Farmer, C.L., (2002), "Upscaling: a review", *Int'l. Journal for Numerical Methods in Fluids* 40, pp. 63-78.
Gai, X., et al., (2005), "A Timestepping Scheme for Coupled Reservoir Flow and Geomechanics in Nonmatching Grids", *SPE 97054, 2005 SPE Annual Tech. Conf. and Exh.*, pp. 1-11.

(56) References Cited

OTHER PUBLICATIONS

Haas, A., et al., (1994), "Geostatistical Inversion—A Sequential Method of Stochastic Reservoir Modeling Constrained by Seismic Data," *First Break* 12, pp. 561-569.
Haugen, K. B., et al., (2013), "Highly Optimized Phase Equilibrium Calculations", *SPE 163583*, pp. 1-9.
Holden, L., et al., (1992), "A Tensor Estimator for the Homogenization of Absolute Permeability", *Transport in Porous Media* 8, pp. 37-46.
Isaaks, E. H., et al., (1989), "Applied Geostatistics", *Oxford University Press*, New York, pp. 40-65.
Journel, A., (1992), "Geostatistics: Roadblocks and Challenges," Geostatistics, *Troia '92: Quanititative Geoglogy and Geostatistics* 1, pp. 213-224.
Kurzak, J., et al., (2007), "Implementation of Mixed Precision in Solving Systems of Linear Equations on the Cell Processor", *Concurrency Computat.: Pract. Exper.* 2007, vol. 19, pp. 1371-1385.
Klie, H., et al., (2005), "Krylov-Secant Methods for Accelerating the Solution of Fully Implicit Formulation", *SPE 92863, 2005 SPE Reservoir Simulation Symposium*, 9 pgs.
Mallat, S., (1999), "A Wavelet Tour of Signal Processing", *Academic Press*, San Diego, pp. 80-91.
Lu, B., et al., (2007), "Iteratively Coupled Reservoir Simulation for Multiphase Flow", *SPE 110114, 2007 SPE Annual Tech. Conf. and Exh.*, pp. 1-9.
Mosqueda, G., et al., (2007), "Combined Implicit or Explicit Integration Steps for Hybrid Simulation", *Earthquake Engng. & Struct. Dyn.*, vol. 36(15), pp. 2325-2343.
Strebelle, S., (2002), "Conditional simulations of complex geological structures using multiple-point statistics," *Mathematical Geology* 34(1), pp. 1-21.
Sweldens, W., (1998), "The Lifting Scheme: A Construction of Second Generation Wavelets," *SIAM Journal on Mathematical Analysis* 29, pp. 511-546.

Qi, D., et al., (2001), "An Improved Global Upscaling Approach for Reservoir Simulation", *Petroleum Science and Technology* 19(7 &8), pp. 779-795.
Verly, G., (1991), "Sequential Gaussian Simulation: A Monte Carlo Approach for Generating Models of Porosity and Permeability," Special Publication No. 3 of EAPG—Florence 1991 Conference, Ed.: Spencer, A.M, pp. 345-356.
Whitcombe, D. N., et al., (2002), "Extended elastic impedance for fluid and lithology prediction," *Geophysics* 67, pp. 63-67.
White, C.D., et al., (1987), "Computing Absolute Transmissibility in the Presence of Fine-Scale Heterogeneity", SPE 16011, $9^{th}$ SPE Symposium in Reservoir Simulation, pp. 209-220.
Wu, X.H., et al., (2007), "Reservoir Modeling with Global Scaleup", SPE 105237, $15^{th}$ SPE Middle East Oil & Gas Show & Conf., 13 pgs.
Yao, T., et al., (2004), "Spectral Component Geologic Modeling: A New Technology for Integrating Seismic Information at the Correct Scale," Geostatistics Banff, *Quantitative Geology & Geostatistics* 14, pp. 23-33.
Younis, R.M., et al., (2009), "Adaptively-Localized-Continuation-Newton: Reservoir Simulation Nonlinear Solvers That Converge All the Time", *SPE 119147, 2009 SPE Reservoir Simulation Symposium*, pp. 1-21.
Zhang T., et al., (2006), "Filter-based classification of training image patterns for spatial Simulation," *Mathematical Geology* 38, pp. 63-80.
Moretti, I., et al., (2006), "KINE3D: A New 3D Restoration Method Based on a Mixed Approach Linking Geometry and Geomechanics", Oil & Gas Science and Technology—Rev. IFP, vol. 61, No. 2, pp. 277-289.
Muron, Pierre, (2005), "Numerical Methods 3-D for the Restoration of the Geological Structures Faulted", Institut National Polytechnique de Lorraine, Center of Research Petrographic and Geochemical Data, 154 pgs.

* cited by examiner

MANAGING DISCONTINUITIES IN GEOLOGIC MODELS

CROSS-REFERENCE TO RELATED APPLICATION

This application claims the benefit of U.S. Provisional Patent Application Nos. 62/221,915 filed Sep. 22, 2015 entitled MANAGING DISCONTINUITIES IN GEOLOGIC MODELS, 62/073,465 filed Oct. 31, 2014 and 62/081,159 filed Nov. 18, 2014, the entirety of each which is incorporated by reference herein.

FIELD OF THE INVENTION

This disclosure relates generally to the field of hydrocarbon exploration and production and, more particularly, to geologic modeling. Specifically, the disclosure relates to a method for constructing a subsurface model to address discontinuities in a subsurface region. The updated subsurface model may be used for hydrocarbon operations, such as hydrocarbon exploration and/or hydrocarbon production.

BACKGROUND

This section is intended to introduce various aspects of the art, which may be associated with exemplary embodiments of the present disclosure. This discussion is believed to assist in providing a framework to facilitate a better understanding of particular aspects of the present invention. Accordingly, it should be understood that this section should be read in this light, and not necessarily as admissions of prior art.

In exploration or production stages for resources, such as hydrocarbons, different types of subsurface models may be used to represent the subsurface structure, a description of a subsurface structure and material properties for a subsurface region. For example, the subsurface model may be a geologic model or a reservoir model. The geologic model may represent measured or interpreted data for the subsurface region, such as seismic data and well log data. The geologic model may be within a physical space or domain, and may include objects (e.g., horizons, faults, volumes, and the like) and may have material properties associated with the various objects. The geologic model may also be discretized with a mesh or a grid that includes nodes and forms cells (e.g., blocks or elements) within the model. The reservoir model may be generated from the geologic model and may be used to simulate flow of fluids within the subsurface region. Accordingly, the reservoir model may use the same grid and/or cells, or may upscale the grid and/or cells to lessen the computations for simulating the fluid flow.

The development of the geologic model may be problematic. For example, populating n-dimensional (nD) spaces or domains with material properties where the space includes multiple separate nD objects is a problematic process in forming the subsurface models. The objects may partially contact each other, thus, forming a non-manifold topology. Further, the material properties in the space are typically assigned, which may be performed by a designer, modeler or user, to only one continuous object at a time. For flexibility in this approach, the original or physical domain, which may be referred to as a "physical space", may be mapped to a design domain, which may be referred to as a "design space". The design space includes the separate objects, which are pieced together based on some geometric criterion, and may form a continuous volume or an unfaulted volume. The mapping should be performed in manner to minimize deformation and to preserve in the design space the resemblance to the physical space (e.g., the original domain). This mapping is then used to facilitate the populating of the design space with the material properties.

For example, in geologic modeling of a subsurface region, a three-dimensional (3D) model domain is delineated by horizons and faults, where horizons are primarily flat horizontal surfaces related to deposition of sediment material forming a reservoir rock, and faults are discontinuities in the rock introduced by non-depositional events. The material properties, such as the rock properties, are typically described in a continuous volume in the design space or depositional space, which may be provided by the user or modeler, while the physical space of the subsurface model may be a discontinuous volume that includes discontinuities in the form of post-depositional faults. Construction of design space corresponds to generation of a continuous volume from a faulted structural framework by removing the discontinuities, such as nodal slips.

As another example, U.S. Pat. No. 7,480,205 describes a method of solving geo-mechanical equations for a displacement field using a mesh that conforms to the horizons and faults in a geological model. This method involves the user specifying a slip vector and may involve time consuming iterations to resolve penetrations and gaps between fault blocks. As such, this method may be problematic because specifying the slip vector may be challenging and the interiors points may not match.

As yet another example, U.S. Pat. No. 8,315,845 describes a method of solving geomechanical equations for a displacement field using a mesh that conforms to the horizons and faults in the framework. While this method does not require the user to specify a slip vector, the method involves representing more than one horizon to be substantially planer and parallel. Further, the method does not measure, much less, reduce penetration or gaps between fault blocks away from fault/horizon intersections. Additionally, the requirement to flatten by specifying boundary conditions for more than one horizon may significantly distort the layer thickness profile in the physical space.

In U.S. Pat. No. 7,711,532, the method describes "parametric" mapping to the design space, which is defined by solving a constrained optimization problem for three transfer functions u,v,t on supporting 3D tetrahedral meshes that conforms to fault surfaces. The method describes that only tetrahedral mesh may be used, some of the constraints are heuristic and may be application-dependent, and special handling is required for erosional horizons.

Other conventional approaches, such as U.S. Pat. No. 6,106,561, are based on utilizing the ijk indexing system of the corner point grid built in the physical space for mapping to design space. Thus, generation of the mapping logic is combined with the logic for corner-point grid generation. Such kinds of mappings are very approximate and do not account for volume distortion of corner-point cells.

Accordingly, there remains a need in the industry for methods and systems that are more efficient and may be constructed to lessen problems associated with discontinuities in geologic modeling. The present techniques provide a method and apparatus that overcome one or more of the deficiencies discussed above.

SUMMARY

In one embodiment, a method for generating a geologic model having one or more material properties for a faulted subsurface region is described. The method includes: obtaining a geologic model in physical space representing a subsurface region, wherein the subsurface region includes one or more faults and one or more horizons (e.g., at least two horizons), wherein the geologic model includes a mesh that includes a plurality of nodes and forms a plurality of cells and each of the one or more faults has corresponding fault surfaces; parameterizing each of the corresponding fault surfaces of the one or more faults; solving one of an energy optimization equation and conservation law equation for the corresponding fault surfaces based on parameterized nodes on the fault surfaces to generate a displacement map, wherein the displacement map relates points between the physical space and a design spaces; mapping the geologic model in the physical space to create a design model in the design space based on the displacement map, wherein the design model forms a unfaulted volume that includes the one or more horizons from the geologic model in the physical space and the design model includes an updated mesh that forms a design domain or a plurality of design cells; assigning values of one or more material properties to the design model to form a populated design model; mapping the populated design model to create a populated geologic model in the physical space based on the displacement map, wherein the populated geologic model includes the mesh, the plurality of cells, and assigned values of material properties; and using the populated geologic model for hydrocarbon operations associated with the subsurface region.

In another embodiment, a system for generating a geologic model having one or more material properties for a faulted subsurface region is described. The system comprising: a processor; an input device in communication with the processor and configured to receive input data associated with a subsurface region; and memory in communication with the processor, the memory having a set of instructions. The set of instructions, when executed, are configured to: obtain a geologic model in physical space representing a subsurface region, wherein the subsurface region includes one or more faults and one or more horizons, wherein the geologic model includes a mesh that includes a plurality of nodes and forms a plurality of cells and each of the one or more faults has corresponding fault surfaces; parameterize each of the corresponding fault surfaces of the one or more faults; solve one of an energy optimization equation and conservation law equation for the corresponding fault surfaces based on parameterized nodes on the fault surfaces to generate a displacement map, wherein the displacement map relates points between the physical space and a design spaces; map the geologic model in the physical space to create a design model in the design space based on the displacement map, wherein the design model forms a unfaulted volume that includes the one or more horizons from the geologic model in the physical space and the design model includes an updated mesh that forms a design domain or a plurality of design cells; assign values of one or more material properties to the design model to form a populated design model; map the populated design model to create a populated geologic model in the physical space based on the displacement map, wherein the populated geologic model includes the mesh, the plurality of cells, and assigned values of material properties; and store the populated geologic model in memory.

BRIEF DESCRIPTION OF THE DRAWINGS

The advantages of the present invention are better understood by referring to the following detailed description and the attached drawings.

DETAILED DESCRIPTION

Figure 1:
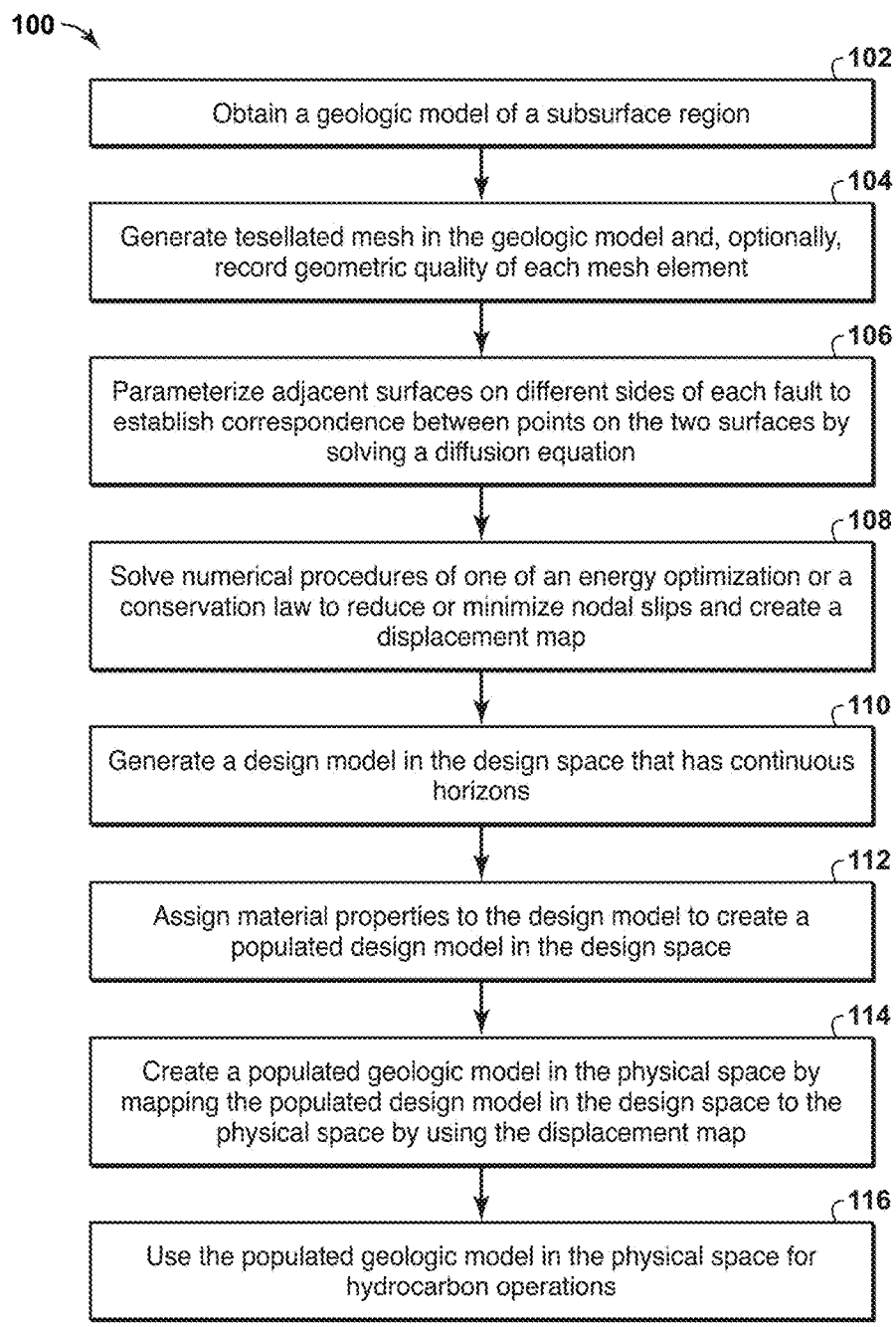
FIG. 1 is an exemplary flow chart in accordance with an embodiment of the present techniques.

In the following detailed description section, the specific embodiments of the present disclosure are described in connection with preferred embodiments. However, to the extent that the following description is specific to a particular embodiment or a particular use of the present disclosure, this is intended to be for exemplary purposes only and simply provides a description of the exemplary embodiments. Accordingly, the disclosure is not limited to the specific embodiments described below, but rather, it includes all alternatives, modifications, and equivalents falling within the true spirit and scope of the appended claims.

Various terms as used herein are defined below. To the extent a term used in a claim is not defined below, it should be given the broadest definition persons in the pertinent art have given that term as reflected in at least one printed publication or issued patent.

The articles "the", "a" and "an" are not necessarily limited to mean only one, but rather are inclusive and open ended so as to include, optionally, multiple such elements.

As used herein, the term "hydrocarbons" are generally defined as molecules formed primarily of carbon and hydrogen atoms such as oil and natural gas. Hydrocarbons may also include other elements or compounds, such as, but not limited to, halogens, metallic elements, nitrogen, oxygen, sulfur, hydrogen sulfide ($H_2S$) and carbon dioxide ($CO_2$). Hydrocarbons may be produced from hydrocarbon reservoirs through wells penetrating a hydrocarbon containing formation. Hydrocarbons derived from a hydrocarbon reservoir may include, but are not limited to, petroleum, kerogen, bitumen, pyrobitumen, asphaltenes, tars, oils, natural gas, or combinations thereof. Hydrocarbons may be located within or adjacent to mineral matrices within the earth, termed reservoirs. Matrices may include, but are not limited to, sedimentary rock, sands, silicilytes, carbonates, diatomites, and other porous media.

As used herein, "hydrocarbon exploration" refers to any activity associated with determining the location of hydrocarbons in subsurface regions. Hydrocarbon exploration normally refers to any activity conducted to obtain measurements through acquisition of measured data associated with the subsurface formation and the associated modeling of the data to identify potential locations of hydrocarbon accumulations. Accordingly, hydrocarbon exploration includes acquiring measurement data, modeling of the measurement data to form subsurface models and determining the likely locations for hydrocarbon reservoirs within the subsurface. The measurement data may include seismic data, gravity data, magnetic data, electromagnetic data and the like.

As used herein, "hydrocarbon operations" refers to any activity associated with hydrocarbon exploration and/or hydrocarbon production.

As used herein, "hydrocarbon production" refers to any activity associated with extracting hydrocarbons from subsurface location, such as a well or other opening. Hydrocarbon production normally refers to any activity conducted to form the wellbore along with any activity in or on the well after the well is completed. Accordingly, hydrocarbon production or extraction includes not only primary hydrocarbon extraction, but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

As used herein, the term "fault trace" means the intersection lines between a fault surface and the faulted horizon.

As used herein, the term "fault slip" means the average displacement from one horizon to another horizon across a fault.

As used herein, the term "nodal slip" means the displacement vector between a node on one side of a fault to the corresponding location with the same parametric value on the other side of the fault. The nodal slop is the total of the nodal slip and nodal heave.

As used herein, the term "unfaulted volume" means a volume that contains nodal slip magnitude that are all below a specific threshold. The specific threshold may be a 0.1% of the layer thickness, with a layer being bounded by two horizons. Alternatively, the specific threshold may be 0.1% of the distance from one horizon to another horizon after the mapping.

In geologic modeling of subsurface regions, a subsurface model is created in the physical space or domain to represent the subsurface region. The subsurface model may include multiple dimensions and is delineated by objects, such as horizons and faults. The subsurface model may be represented in the physical space and have a mapping to other spaces, such as a design space. The subsurface model may include a framework of objects, such as faults and horizons, and may include a mesh or grid of nodes to divide the subsurface model into cells, which may include blocks or elements. A cell, block or element is a subvolume of the space, which may be constructed from nodes within the mesh, for example. In the subsurface model, material properties, such as rock properties (e.g., permeability and/or porosity), may be represented as continuous volumes or unfaulted volumes in the design space, while the physical space may be represented as discontinuous volumes or faulted volumes (e.g., contain volume discontinuities, such as post-depositional faults). The present techniques may be utilized to lessen or remove nodal slips and construct a design model having a continuous volume or unfaulted volume from a faulted geologic model or framework.

In one or more embodiments, the present techniques describe a method for optimal construction of a conceptual 3D grid with less influence from the subsurface domain's discontinuities. The grid may be used in subsurface models for hydrocarbon operations, such as reservoir simulation studies in reservoir exploration and/or production stages, as well as for representing a geologic model description of a reservoir structure and material properties. In addition, the grid may be configured to represent material properties, such as rock and fluid properties, of a reservoir or may be used for numerical discretization of partial differential equations, such as fluid flow or wave propagation. Thus, the present techniques may be used to enhance subsurface models, which may be used for hydrocarbon operations and, more particularly, to subsurface modeling.

Further, in one or more embodiments, the present techniques involve a method of solving a minimization problem to enhance the subsurface model. The method includes: obtaining a subsurface model of a subsurface region and generating a mesh to discretize the subsurface model in the physical space, which is delineated by faults and horizons. The mesh may either directly honor the geometries of faults and horizons or involve cell (e.g., element or block) splitting. Then, the method includes parameterizing the surfaces on the two sides (e.g., different surfaces) of each fault and assigning surface parameterization values to each node on the fault surfaces. For each node on the fault surfaces, the method may include computing the nodal slip between the node and the corresponding location on the opposing surface of the fault. The corresponding location has the same surface parameterizations values as the node. Then, the method may include determining an objective function which penalizes the nodal slip and the mesh deformation. Finally, the method may include minimizing the objective function by adjusting positions of mesh nodes.

In another embodiment, the present techniques involve a method of numerically solving a system of partial differential equations based on one or more conservation laws or principles to enhance the subsurface model. The method includes obtaining a subsurface model of a subsurface region, generating a mesh to discretize the physical space of the subsurface model, parameterizing the surfaces on the adjacent sides (e.g., surfaces) of each fault and assigning surface parameterization values to each node on the fault surfaces, and computing the nodal slip between the node and the corresponding location on the opposing side of the fault, as noted above. However, this method may also include numerically solving a system of partial differential equations based on one or more conservation principles with rock and interface treatments on the two surfaces of each fault to enforce continuity. The possible interface treatments may include penalty methods, Nitsche methods, and/or discontinuous Galerkin methods.

In yet another embodiment, the present techniques involve a method of numerically solving a system of partial differential equations based on one or more conservation laws or principles with a boundary condition applied to a single horizon to enhance the subsurface model. The method includes obtaining a subsurface model of a subsurface region, generating a mesh to discretize the subsurface model in the physical space, parameterizing the surfaces on the two sides of each fault and assigning surface parameterization values to each node on the fault surfaces, and computing the nodal slip between the node and the corresponding location on the opposing surface of the fault, as noted above. Further, the method includes numerically solving a system of partial differential equations based on one or more conservation principles with rock and interface treatments on the two surfaces of each fault to enforce continuity, which is solved with a boundary condition applied to a single horizon.

In certain embodiments, the present techniques may utilize a subsurface model having horizons and faults. The subsurface model may have a mesh of any type with edges (e.g., connecting lines of two cells, such as adjoining blocks or elements) that do not cross horizon surfaces that are intersected by fault surfaces. The subsurface model may also utilize a mesh with edges that cross the surfaces, but represent a discontinuity introduced by the horizons and faults by local grid refinement or discontinuity enrichment (e.g., U.S. Pat. No. 8,190,414). A mapping to a design space from the physical space is determined as a result of fault surface parameterization and by applying numerical methods or procedures to minimize or lessen both nodal slips and volumetric distortion. The present techniques involves the geometry and topology of the supporting mesh (e.g., no special treatment for different types of surfaces) and does not involve the user having to provide a slip vector, as required in other approaches, such as U.S. Pat. No. 7,480,205. The mapping may be used to build a subsurface model of physical properties, which can then be used for hydrocarbon prospecting or reservoir development. For example, other approaches may include U.S. Patent Application Ser. No. 62/031,097, which is hereby incorporated by reference and U.S. Patent Application Publication No. 2013/0246031, which is hereby incorporated by reference.

In other certain embodiments, the present techniques include a method for generating a subsurface model of one or more material properties of a faulted subsurface region for hydrocarbon operations, such as prospecting or reservoir development. The method includes: (a) generating, using a computer, a mapping of a subsurface model having a mesh representing a physical space of the subsurface region, which may include faults, to subsurface model having a mesh representing a continuous design space (e.g., forming an unfaulted volume in the design space) in which all faults are removed, the mapping being designed to lessen deformation in mesh cells; (b) assigning values of the material property to continuous volumes in the optimized mesh to generate a subsurface model of the material property in the design space, and using that to generate a subsurface model of the material property in the faulted physical space; and (c) using the subsurface model of the material property in the faulted physical space for hydrocarbon prospecting or reservoir development in the subsurface region.

In yet other embodiments, the present techniques may also addresses the problem of design space construction, as a mesh deformation problem. The mapping of a point P to or from design space is defined from the coordinates of nodes, such as mesh vertices, before (e.g., physical space) and after deformation (e.g., design space), the location of point P in the mesh (which cell it belongs to), and the local geometric basis of that cell (e.g., piece-wise linear interpolation between the vertices of a tetrahedron). The method significantly lessens or eliminates nodal slip with minimal distortion in the volumetric domain pieces or subvolumes delineated by horizons or faults. Accordingly, defining the nodal slip (e.g., the displacement vector between a node on the fault surface and the corresponding location on the other side of the fault) has to be defined in this method.

In contrast to conventional approaches, the present techniques may involve parameterizing adjacent surfaces on different sides of each fault to establish correspondence between points on the adjacent surfaces by solving a diffusion equation and solving numerical procedures, such as an energy optimization method or equation or a conservation law method or equation, to reduce or minimize nodal slips and create a displacement map. For example, various numerical procedures may be used to reduce or minimize nodal slips. By way of example, two different methods are described below, which is merely descriptive and is not construed as limiting the scope of the present techniques.

The first method is minimizing nodal slips and mesh deformation with an energy conservation method or equation. In this method, an objective function P is defined as a function of the displacement of all nodes in the volumetric mesh, i.e. P=f($u_1, u_2, \ldots, u_{Nn}$), where $u_i$ denotes displacement vector at the node i and Nn is the number of all the nodes in the subsurface model. The objective function P measures the energy caused by deformation and nodal slips. After applying optimization algorithms to minimize the objective function P, a displacement solution is determined to minimize objective function P and consequently both deformation and nodal slips.

While the objective function may be defined in a variety of equations, one example objective function is defined below in equation (e1):

$$\mathcal{P} = \sum_{i=1}^{N_c} \frac{1}{2} \int E \cdot S(E) d\Omega_i^e + \sum_{i=1}^{N_f} \frac{1}{2} K \|(x_i + u_i) - (x_i^c + u_i^c)\|^2 \quad (e1)$$

where the first term represent the deformation energy (e.g., summed over $N_e$) and the second term arises from the nodal slips (e.g., summed over $N_f$). In the first term of the equation (e1), $N_e$ is the number of volumetric cells or elements, E, which may be blocks, is the strain tensor which can be approximated as a function of nodal slips (e.g., $u_i$, i=1, 2, \ldots, $N_n$). S(E) is the stress tensor and is a function of E whose specific form depends on the type of constitutive model employed. $\Omega_i^e$ is the physical domain occupied by the element i.

In the second term of equation (e1), $N_f$ is the number of nodes on the fault surfaces. K is a penalty parameter employed to penalize nodal slips. x denotes nodal coordinates. $x_i^c$ and $u_i^c$ denote the location and displacement, respectively, at the corresponding location on the other side of the fault.

Equation (e1) may be linearized to provide a simpler and faster optimization. This is achieved by assuming linear relationship between E and u as well as E and S, as shown below in equations (e2) and (e3) as follows:

$$E = \tfrac{1}{2}(\nabla u + \nabla u^T) \quad (e2)$$

$$S = C[E] \quad (e3)$$

where C is a fourth order tensor mapping strain tensors linearly to stress tensors. In general, it is a function of the location. The resulting linearized objective function is provided in equation (e4) as follows:

$$\mathcal{P}^{lin} = \sum_{i=1}^{N_c} \frac{1}{2} \int E \cdot C(E) d\Omega_i^e + \sum_{i=1}^{N_f} \frac{1}{2} K \|(x_i + u_i) - (x_i^c + u_i^c)\|^2 \quad (e4)$$

Using certain quadrature rule to evaluate the integration over $\Omega_i^e$ and the finite element interpretation to interpret displacement in each element, the minimization of $P^{lin}$ may be determined as the solution of following matrix equation (e5) and (e6), as follows:

$$Ku = 0 \quad (e5)$$

where u=($u_{1x}, u_{1y}, u_{1z}, u_{2x}, u_{2y}, u_{2z}, \ldots, u_{Nnx}, u_{Nny}, u_{Nnz}$), and $$K = \frac{\partial \mathcal{P}^{lin}}{\partial u}. \tag{e6}$$

It is noted that the method or procedure involves the user to input two parameters. One parameter is the location dependent elastic tensor C and the other parameter is the nodal spring penalty term K. Increasing the elastic tensor C in a specific region may result in less deformation in that region, while increasing the latter may enforce continuity across the fault. The appropriate values for the two parameters may depend on the optimization preferences.

The second method is another numerical procedure that is a conservation law method or equation. This method may be used to reduce or minimize nodal slips is enforcing continuity by integrating constraints. In this method, certain constraints are applied between the two sides of each fault and then a certain type of conservative equation is solved, which includes both fault blocks and the constraints, such as equation (e7), for example. The result of the numerical method is the displacement vector at each node which deforms the volumetric mesh to accommodate for the imposed constraints. One equation may be the steady-state conservation law of linear momentum, as set forth as equation (e7) below:

$$\nabla \cdot S + f_b = 0 \tag{e7}$$

where S is the stress tensor and $f_b$ is the body force (e.g. gravity).

By integrating the constraint into the weak form of the conservation law equation (e7), and the applying finite element interpolation, the resulting equation (e8) for the numerical method is determined Find $u^h \in U$ such that for all $w^h \in W$.

$$\sum_{i=1}^{N_c} \int \nabla w^h \cdot S d\Omega_i^e + \mathcal{T}(w^h, u^h) = 0 \tag{e8}$$

where U and W are appropriate trial and weight function sets for a finite element analysis, and $\mathcal{T}$ represents the constraint terms, $w^h$ is a function within the function set W and $u^h$ is a function within the function set U. One possibility of $\mathcal{T}$ is set forth in equation (e9) below:

$$\mathcal{T}_s = \sum_{i=1}^{N_f} (w_i^h - (w_i^c)^h) \cdot K((x_i + u_i^h) - (x_i^c + (u_i^c)^h)) \tag{e9}$$

Another method to define $\mathcal{T}$ may be based on the Discontinuous Galerkin Method, as shown in equation (e10) below:

$$\mathcal{T}_{DG} = \sum_{i=1}^{N_f} \left( \int_{\Gamma^-} w^h \cdot \{\sigma n\} + \int_{\Gamma^+} w^h \cdot \{\sigma n\} + \right.$$
$$\int_{\Gamma^-} (w_i^h - (w_i^c)^h) \cdot k(x + u - x^c - u^c) +$$
$$\left. \int_{\Gamma^+} (w_i^h - (w_i^c)^h) \cdot k(x + u - x^c - u^c) \right) \tag{e10}$$

where n is the surface normal. $\{.\}_w$ is the average operator and defined for an arbitrary function off as defined in equation (e11) below:

$$\{f\}_w = (1-w) f|_{x} + w f|_{x^c} \tag{e11}$$

where w is the weight which a number between 0 and 1. k in equation (e10) is a parameter for numerical stability. The values for w and k can be specified following guidance from literature on interior penalty Discontinuous Galerkin method.

For both methods, the location dependent in-situ stresses may be added to the stress tensor in equation (e1) and equation (e7) to reverse the effect of compaction on the layer shape and layer thickness. As a result of this consideration, the layer thickness may be more even in the physical space. Additionally, appropriate boundary conditions may be applied on the boundaries of the domain or one or more of the horizons to make the solution of the two methods unique.

Beneficially, the present techniques provide various enhancements to the hydrocarbon extraction process. For example, one enhancement is an efficient, robust and flexible method to remove faults from a model of discontinuous in the physical space. The present techniques may be further understood with reference to FIGS. 1 to 10, which are described further below.

FIG. 1 is an exemplary flow chart 100 in accordance with an embodiment of the present techniques. The flow chart 100 includes a method for generation of a mapping from the physical space to the design space.

The method begins with the obtaining of a subsurface model of a subsurface region, as shown in block 102. The subsurface model may be a geologic model that represents a specific portion of the subsurface region. The subsurface model may include one or more objects (e.g., horizons, faults, volumes, and the like) and may have material properties associated with the various objects. The subsurface region may form a discontinuous volume because it includes faults that divide horizons to form disjointed segments.

At block 104, a tessellated mesh is generated and, optionally, the geometric quality of each mesh element is recorded. The mesh element may be a block or cell formed by the mesh and associated nodes. The tessellation mesh may discretize the subsurface model with a mesh or a grid that includes various nodes. The nodes may form mesh elements, such as cells or blocks, within the subsurface model, which may contain the boundaries or edges of surfaces formed with the elements. For example, each mesh element in a 3D grid may be a tetrahedron, and this geometrical classification may be considered the shape or type of the mesh element. A variety of known techniques exist for tetrahedral mesh generation in a volumetric domain (e.g., Delaunay tetrahedralization, or advancing front methods), which may be used in the present techniques. However, the present techniques are not limited to tetrahedral grids, as any finite-element grid, or even hybrid grid of several element types, such as prisms and tetrahedrals, may be utilized. To facilitate the mapping process, it may be preferable that the initial grid be cut or non-conforming across discontinuities, which may be performed by mirroring grid faces on the discontinuities if the generated grid is conforming.

Once the mesh is tessellated, adjacent surfaces on the two sides of each fault are parameterized and a correspondence between points on the two sides of a fault is established, as shown in block 106. To obtain surface parameterization values, Poisson's equation, which is known to those skilled in the art, may be solved only on the fault surfaces (e.g., not in the volume) with certain surface parameterization values specified as boundary conditions. By way of example, the method may include stripping the surface mesh on the fault from the volume mesh. For the first set of surface parameterization values, the boundary conditions can be specified as the horizon identification on the intersection nodes between the fault surface and horizon surface. As an example, nodes, such as a first set of nodes, may be assigned with a value due to the fact that they lie on a specific horizon, such as a first horizon. Similarly, some other nodes, such as a second set of nodes, may be assigned with another value because they lie on a different horizon, such as a second horizon. To find the parameterization value for other interior nodes, the method may solve a diffusion equation, such as a Poisson's equation, which may be solved using the boundary conditions specified on fault/horizon intersection. The second surface parameterization values may be obtained similarly by solving Poisson's equation with boundary conditions being on one edge and others on the other edge. The Poisson's equation can be solved using any suitable numerical methods, for example, the finite element method or boundary element method. If the finite element method is used, the surface parameterization values are solved at nodes. To obtain the surface parameterization values in the interior of an element, one can simply interpolate from the nodal values. Examples of this are described further below in FIGS. 5 and 6.

At block 108, numerical procedures of one of an energy optimization or a conservation law, which are described above, are solved to reduce or minimize nodal slips and create a displacement map. The numerical procedures are invoked to reduce or minimize nodal slips. The numerical procedures may be used to move and deform the cells (e.g., blocks). The outcome of the numerical procedure is the displacement vector of each node of the volumetric mesh. Using the computed displacement vector to move each node may result in a deformed mesh, which describes the continuous design space. The mapping can be evaluated as piece-wise continuous on the mesh elements.

Then, at block 110, a design model in the design space is generated. The design model may be generated by mapping the geologic model in the physical space to the design space based on the displacement map. The displacement map assigns a displacement vector for each point in the volume from one space to another space. The design model, which is an updated geologic model, may form an unfaulted volume that includes the one or more horizons (e.g., two or more horizons) from the geologic model in the physical space, but has removed or lessened the faults below a specific threshold. The design model may also include an updated mesh that forms a design domain or a plurality of design cells. At block 112, values of one or more material properties are assigned to the design model to form a populated design model in the design space. The assignment of the material properties may include assigning one or more of rock or fluid properties, such as permeability and/or porosity, to each design cell or the design domain in the design model.

Then, a populated geologic model in the physical space may be created by mapping the populated design model to the physical space based on the displacement map, as shown in block 114. The populated geologic model may include the mesh, the plurality of cells, from the previous version of the geologic model along with the assigned values of material properties from the populated design model.

Then, the populated geologic model in the physical space may be used for hydrocarbon operations, as shown in block 116. The populated geologic model may be outputted. The outputting of the populated geologic model may be displayed on a monitor and/or may be stored in memory of a computer system. Further, the populated geologic model may be used to perform activities for hydrocarbon operations. The hydrocarbon operations may include hydrocarbon exploration operations and/or hydrocarbon production operations. For example, the populated geologic model may be used to adjust hydrocarbon exploration operations. For example, the populated geologic model may be used to estimate or adjust reserves forecasts, reserves estimations and/or well performance prediction. Further, as another example, the populated geologic model may be used to adjust hydrocarbon production operations. In particular, the populated geologic model may be used to model the subsurface region to install or modify a well or completion, to modify or adjust drilling operations, to mitigate the contribution in the current or future wells by decreasing fracture penetration, and/or to install or modify a production facility for the production of hydrocarbons from the production intervals that provide access to the hydrocarbons in the subsurface formation. The production facility may include one or more units to process and manage the flow of production fluids, such as hydrocarbons and/or water, from the formation. To access the production intervals, the production facility may be coupled to a tree and various control valves via a control umbilical, production tubing for passing fluids from the tree to the production facility, control tubing for hydraulic or electrical devices, and a control cable for communicating with other devices within the wellbore. The strategy may adjust the well locations, fracture depths and patterns, etc.

Beneficially, this method provides an enhancement in the production and exploration of hydrocarbons. In particular, the method may be utilized to enhance assignment of material properties to geologic models by enabling continuous functions to model properties in an unfaulted volume with discontinuities effectively removed.

Figure 2:
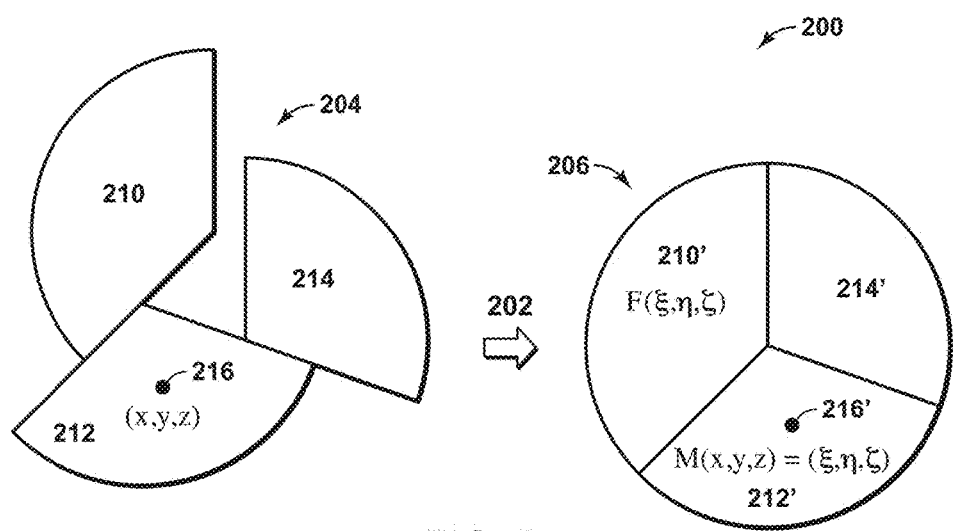
FIG. 2 is a schematic diagram of a mapping of objects from the physical space to the design space.

FIG. 2 is a schematic diagram 200 illustrating a mapping 202 of objects from the physical space 204 to the design space 206. In this diagram 200, various objects, such as objects 210, 212 and 214 form a discontinuous volume in the physical space 204. The mapping 202 is utilized to form a continuous volume or unfaulted volume of objects 210', 212' and 214' in the design space 206, which are associated with the objects 210, 212 and 214 in the physical space 204. As part of this mapping, the point 216 having coordinates (x, y, z) in the physical space may be mapped to the point 216' in the design space. In the design space, material properties may be defined for the objects 210', 212' and 214'. These material properties may be defined by a user. The material properties may include permeability, porosity, and density.

Figures 3A, 3B:
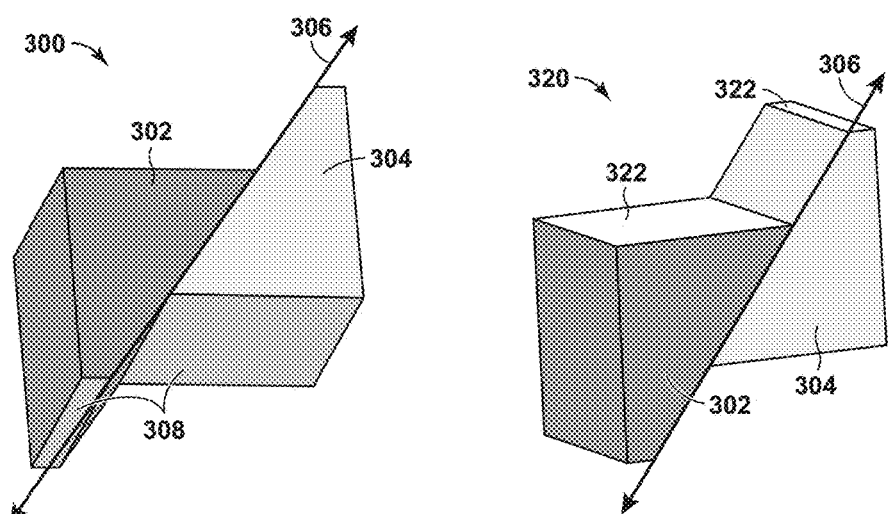
FIGS. 3A and 3B are diagrams of a faulted boundary between two blocks in different views.

As another example, FIGS. 3A and 3B are diagrams 300 and 320 of a faulted boundary between two blocks 302 and 304 in different views. In the diagrams 300 and 320, the geometries of a simple problem and the location of the fault and horizons are described. In particular, the block 302 and block 304 are separated by a faulted boundary, which is indicated by line 306. Each of the blocks 302 and 304 has two horizons that are discontinuous. FIG. 3A is a perspective view of the blocks 302 and 304 that provide a view of a first horizon 308, while FIG. 3B is a perspective view of the blocks 302 and 304 that provide a view of a second horizon 322.

Figure 4:
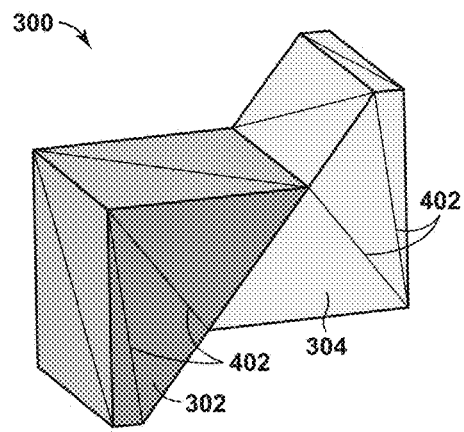
FIG. 4 is a diagram of a volumetric mesh of the blocks.

FIG. 4 is a diagram 400 of a volumetric mesh 402 of the blocks 302 and 304. The mesh 402 may be generated by tessellation of the volume. Then, the geometric quality of each mesh element may be recorded and stored in memory.

For example, each mesh element in a 3D grid may be a tetrahedron, and the geometrical classification may be considered the quality of the mesh element or cell. A variety of known techniques exist for tetrahedral mesh generation in a volumetric domain (e.g., Delaunay tetrahedralization, or advancing front methods), as noted above in block 104 of FIG. 1. While any mesh generation techniques may be used, the present techniques are not limited to tetrahedral grids, as any finite-element grid, even hybrid of several element types, such as prisms and tetrahedrals, may also be utilized. While the meshes 402 are shown as being the same mesh in this diagram 400, each of these meshes may be different in other embodiments. To facilitate the mapping process, the initial grid 402 may be cut or non-conforming across discontinuities, which may be achieved by mirroring grid faces on the discontinuities if the generated grid was conforming. The fault surfaces are described further in FIG. 5.

Figure 5:
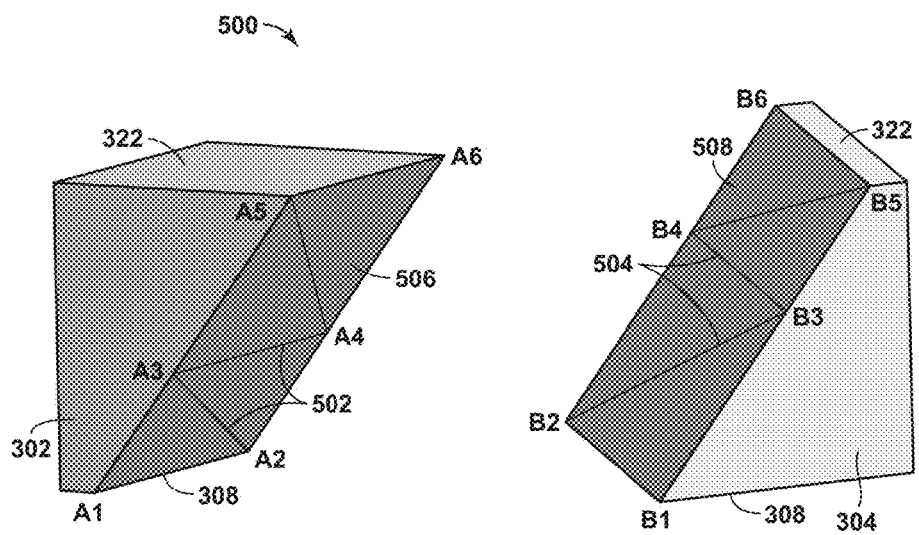
FIG. 5 is a diagram of meshes on the fault surfaces of the blocks.

FIG. 5 is a diagram 500 of meshes 502 and 504 on the fault surfaces 506 and 508 of the blocks 302 and 304. The meshes 502 and 504 are employed to solve for parameterization values, as set forth in block 106 of FIG. 1. The meshes 502 and 504 are different meshes, which may be the same mesh in certain embodiments. By parameterizing the fault surfaces 506 and 508, a correspondence may be established between points, such as nodes A1 to A6 and B1 to B6, on the respective fault surfaces 506 and 508. As noted above, obtaining surface parameterization values may include solving a Poisson's equation only on the fault surfaces 506 and 508 with certain surface parameterization values specified as boundary conditions. The meshes 502 and 504 are used to replace the mesh 402 of FIG. 4. By way of example, for the first set of surface parameterization values, the boundary conditions can be specified as the horizon identifications on the intersection nodes. For example, nodes A5, A6, B5, and B6 are assigned with value 1 because they are associated with the horizon 322, while nodes A1, A2, B1 and B2 are assigned with value 0 because they are associated with horizon 308, which is not visible in this view, but is referenced by arrow 308. To find the parameterization value for other interior nodes, such as nodes A3, A4, B3, and B4, a Poisson's equation is solved using the boundary conditions specified on fault/horizon intersection (e.g., nodes A1, A2, B1, B2, A5, A6, B5 and B6). The second surface parameterization values may be obtained similarly by solving Poisson's equation with boundary conditions being a value of 0 on one edge (e.g., the line formed by nodes A1-A3-A5 for hanging wall and the line formed by nodes B1-B3-B6 for foot wall) and a value of 1 on the other edge (e.g. the line formed by nodes A2-A4-A6 for hanging wall and the line formed by nodes B2-B4-B5 for foot wall). The Poisson's equations may be solved using any suitable numerical methods, such as finite element method or boundary element method. In diagram 500, the surface parameterization values for a finite element method are solved at nodes A1 to A6 and B1 to B6.

Figure 6:
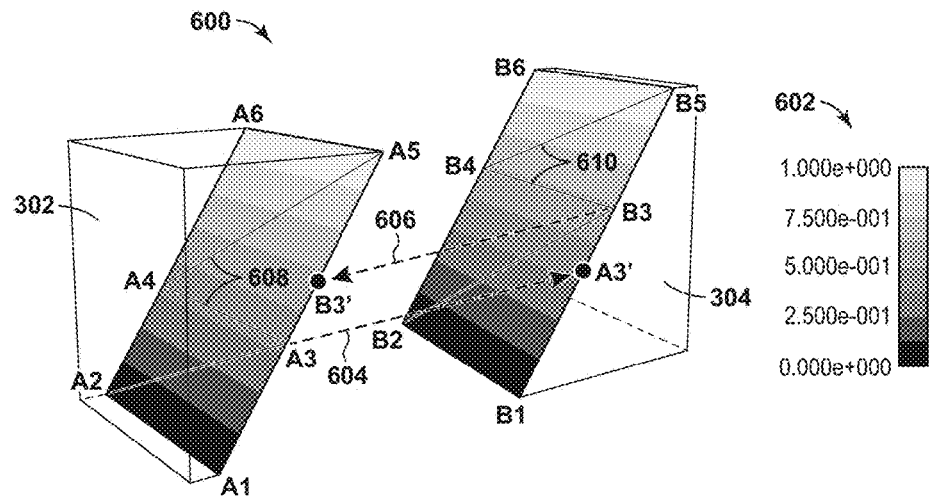
FIG. 6 is a diagram of a first set of computed surface parameterization values for the faults surfaces on the blocks with an associated scale.

FIG. 6 is a diagram 600 of the first set of computed surface parameterization values for the faults surfaces on the blocks 302 and 304 with an associated scale 602. These values are used to search for the corresponding locations of each node on the fault surfaces, which are related by a scale 602 that has a range from 0.0 to 1.0. In this diagram 600, the corresponding location of node A3 is node A3', as shown along the line 604, while the corresponding location of node B3 is node B3', as shown along the line 606. In this diagram 600, the surface parameterization values of point A3 on the hanging wall is (0.403165, 0). The corresponding location of node A3 on the footwall is then located at node A3', which has the same parameterization values as the value at node A3. In another example, the surface parameterization values of node B3 on the footwall is (0.596633, 0). The corresponding location of node B3 on the hanging wall is then node B3', which has the same surface parameterization values as node B3. Based on these computed surface parameterization values for the faults surfaces on the blocks 302 and 304, the gird 608 and 610 are adjusted.

Figure 7:
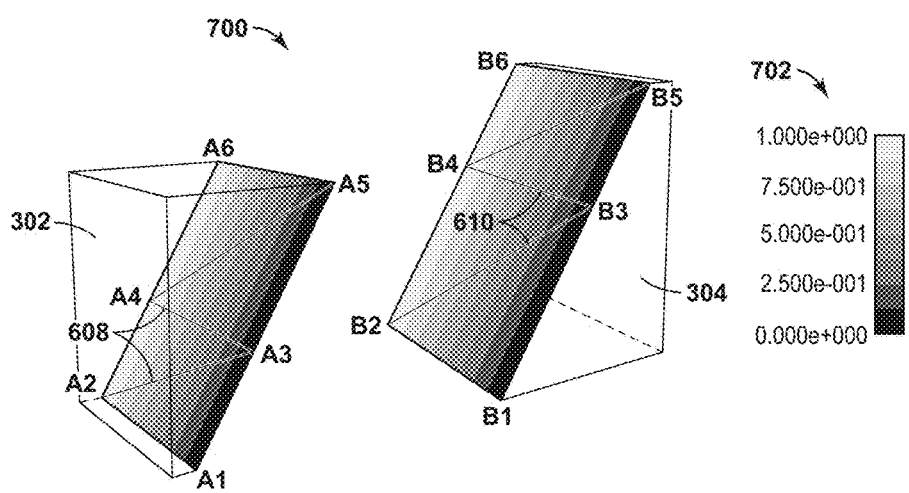
FIG. 7 is a diagram of a second set of computed surface parameterization values for the faults surfaces on the blocks with an associated scale for the adjusted grid from FIG. 6.

FIG. 7 is a diagram of the second set of computed surface parameterization values for the faults surfaces on the blocks 302 and 304 with an associated scale 702 for the adjusted grid from FIG. 6. In this diagram 700, the location of grids 608 and 610 are shown after applying the present techniques in FIG. 6. The scale 702 that has a range from 0.0 to 1.0. In this diagram 600, the corresponding location of node A3 is node A3', while the corresponding location of node B3 is node B3', which is similar to diagram 600 of FIG. 6.

Figure 8:
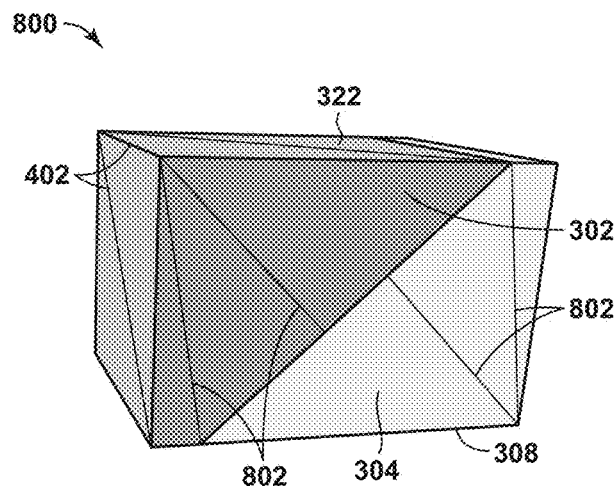
FIG. 8 is a diagram of the continuous blocks in design space with the updated mesh.

FIG. 8 is a diagram of the continuous blocks 302 and 304 in design space with the updated mesh 802. In this diagram 800, the updated mesh 802 is used with the mesh 402 to form the continuous blocks in design space. Further, the horizons 308 and 322 are harmonized in this model to remove discontinuities.

Figure 9A:
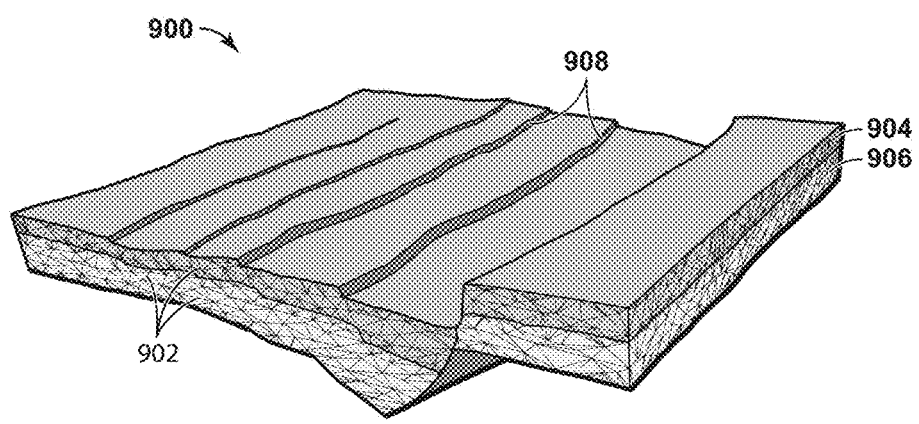
FIGS. 9A to 9D are diagrams of a subsurface model being transformed from the physical space to the design space.
Figure 9B:
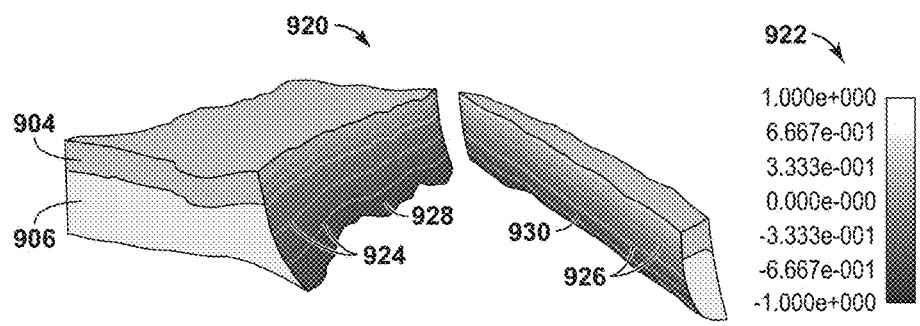
Figure 9C:
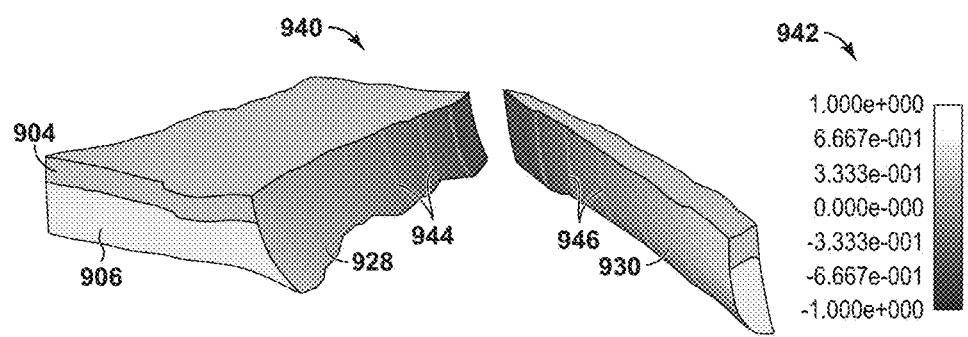
Figure 9D:
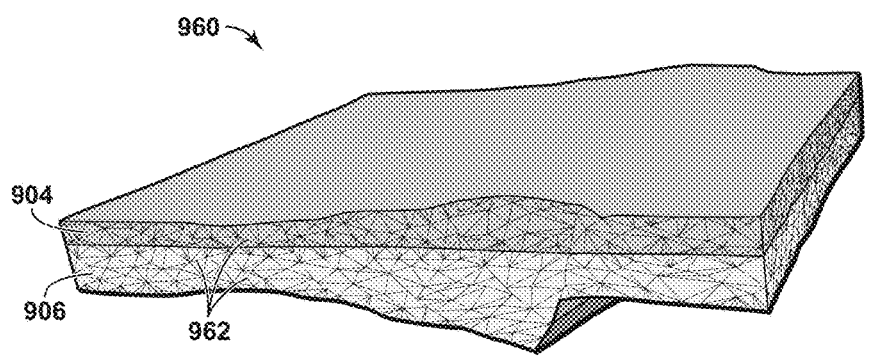
Figure 10:
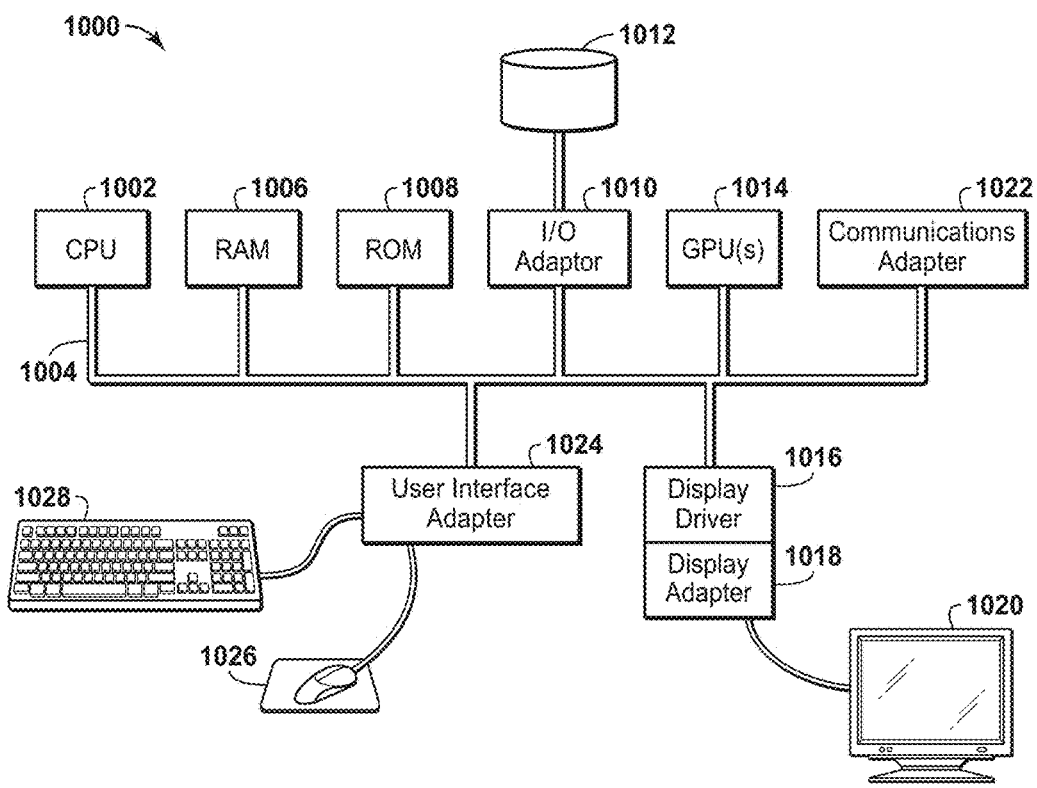
FIG. 10 is a block diagram of a computer system that may be used to perform any of the methods disclosed herein.

Another example for a subsurface region is shown in FIGS. 9A to 9D. FIGS. 9A to 9D are diagrams 900, 920, 940 and 960 of a subsurface model being transformed from the physical space to the design space. In these figures, a discontinuous model is provided with various faults to a subsurface region, which is an example application to geologic modeling. The present techniques may be applied by building a general finite-element mesh in the volumes of the physical space of the geologic model, which are delineated by faults and horizons, which is shown in FIG. 9A. Then, the surfaces on the two sides of each fault is parameterized to establish a correspondence between nodes on the two sides of a fault, which is shown in FIGS. 9B and 9C. Following the parameterization, numerical procedures are used to reduce or minimize nodal slips by moving and deforming the blocks, as shown in FIG. 9D. The resulting subsurface model in the design space has continuous FIG. 10 shows the results of numerical procedure by minimizing nodal slips and mesh deformation. One can observe in the results that the nodal slips are greatly reduced.

FIG. 9A is a diagram 900 of a volumetric mesh 902 applied to blocks in the different layers 904 and 906 in the subsurface model. The mesh 902 may be generated by tessellation of the model, as noted above (e.g., in block 104 of FIG. 1), to form a prismatic mesh, which has a geometric quality of each cell or block. The fault surfaces, such as faults surfaces 908, are described further in FIGS. 9B and 9C.

FIG. 9B is a diagram 920 of fault surfaces 928 and 930 for a portion of the model in FIG. 9A. In this diagram 920, value lines 924 on the fault surface 928 and value lines 926 on the fault surface 930 are provided based on the computed parameterization values. The value lines 924 and 926 may be calculated, as noted above, and are provided on a scale 922 from 1.0 and −1.0. By parameterizing the fault surfaces 928 and 930, a correspondence may be established between points on the respective fault surfaces 928 and 930. As noted above, obtaining surface parameterization values may include solving a Poisson's equation only on the fault surfaces 928 and 930 with certain surface parameterization values specified as boundary conditions.

FIG. 9C is a diagram 940 of fault surfaces 928 and 930 for a portion of the model in FIGS. 9A and 9B. In this diagram 940, value lines 944 on the fault surface 928 and value lines 946 on the fault surface 930 are provided based on the computed parameterization values. In contrast to the value lines 924 and 926 of FIG. 9B, these values lines 944 and 946 are substantially vertical and are provided on a scale 942 from 1.0 and 0.0. By parameterizing the fault surfaces 928 and 930, a correspondence may be established between points on the respective fault surfaces 928 and 930. As noted above, obtaining surface parameterization values may include solving a Poisson's equation only on the fault surfaces 928 and 930 with certain surface parameterization values specified as boundary conditions.

FIG. 9D is a diagram 960 of the continuous model in design space with the updated mesh 962. In this diagram 960, the updated mesh 962 to form the continuous blocks in design space for this model. Further, the horizons, such as horizons 908 ion FIG. 9A, are harmonized in this model to remove discontinuities.

Persons skilled in the technical field will readily recognize that in practical applications of the disclosed methodology, it is partially performed on a computer, typically a suitably programmed digital computer. Further, some portions of the detailed descriptions which follow are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "processing" or "computing", "calculating", "comparing", "determining", "displaying", "copying," "producing," "storing," "adding," "applying," "executing," "maintaining," "updating," "creating," "constructing" "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present techniques also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.), and a machine (e.g., computer) readable transmission medium (electrical, optical, acoustical or other form of propagated signals (e.g., carrier waves, infrared signals, digital signals, etc.)).

Furthermore, as will be apparent to one of ordinary skill in the relevant art, the modules, features, attributes, methodologies, and other aspects of the invention can be implemented as software, hardware, firmware or any combination of the three. Of course, wherever a component of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming Additionally, the present invention is in no way limited to implementation in any specific operating system or environment.

Further, one or more embodiments may include methods that are performed by executing one or more sets of instructions to perform modeling enhancements in various stages. For example, the method may include executing one or more sets of instructions to perform comparisons between thresholds current statuses or indications along with transmitting data between modules, components and/or sensors.

As an example, FIG. 10 is a block diagram of a computer system 1000 that may be used to perform any of the methods disclosed herein. A central processing unit (CPU) 1002 is coupled to system bus 1004. The CPU 1002 may be any general-purpose CPU, although other types of architectures of CPU 1002 (or other components of exemplary system 1000) may be used as long as CPU 1002 (and other components of system 1000) supports the inventive operations as described herein. The CPU 1002 may execute the various logical instructions according to disclosed aspects and methodologies. For example, the CPU 1002 may execute machine-level instructions for performing processing according to aspects and methodologies disclosed herein.

The computer system 1000 may also include computer components such as a random access memory (RAM) 1006, which may be SRAM, DRAM, SDRAM, or the like. The computer system 1000 may also include read-only memory (ROM) 1008, which may be PROM, EPROM, EEPROM, or the like. RAM 1006 and ROM 1008 hold user and system data and programs, as is known in the art. The computer system 1000 may also include an input/output (I/O) adapter 1010, a communications adapter 1022, a user interface adapter 1024, and a display adapter 1018. The I/O adapter 1010, the user interface adapter 1024, and/or communications adapter 1022 may, in certain aspects and techniques, enable a user to interact with computer system 1000 to input information.

The I/O adapter 1010 preferably connects a storage device(s) 1012, such as one or more of hard drive, compact disc (CD) drive, floppy disk drive, tape drive, etc. to computer system 1000. The storage device(s) may be used when RAM 1006 is insufficient for the memory requirements associated with storing data for operations of embodiments of the present techniques. The data storage of the computer system 1000 may be used for storing information and/or other data used or generated as disclosed herein. The communications adapter 1022 may couple the computer system 1000 to a network (not shown), which may enable information to be input to and/or output from system 1000 via the network (for example, a wide-area network, a local-area network, a wireless network, any combination of the foregoing). User interface adapter 1024 couples user input devices, such as a keyboard 1028, a pointing device 1026, and the like, to computer system 1000. The display adapter 1018 is driven by the CPU 1002 to control, through a display driver 1016, the display on a display device 1020. Information and/or representations of one or more 2D canvases and one or more 3D windows may be displayed, according to disclosed aspects and methodologies.

The architecture of system 1000 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may use any number of suitable structures capable of executing logical operations according to the embodiments.

In one or more embodiments, the method may be implemented in machine-readable logic, such that a set of instructions or code that, when executed, performs the instructions or operations from memory. The computer system may include a processor; memory in communication with the processor; and a set of instructions stored on the memory and accessible by the processor, wherein the set of instructions, when executed, are configured to: obtain a geologic model in physical space representing a subsurface region, wherein the subsurface region includes one or more faults and one or more horizons (e.g., at least two horizons), wherein the geologic model includes a mesh that includes a plurality of nodes and forms a plurality of cells and each of the one or more faults has corresponding fault surfaces; parameterize each of the corresponding fault surfaces of the one or more faults; solve one of an energy optimization equation and conservation law equation for the corresponding fault surfaces based on parameterized nodes on the fault surfaces to generate a displacement map, wherein the displacement map relates points between the physical space and a design spaces; map the geologic model in the physical space to create a design model in the design space based on the displacement map, wherein the design model forms a unfaulted volume that includes the one or more horizons from the geologic model in the physical space and the design model includes an updated mesh that forms design domain; assign values of one or more material properties to the design domain or the plurality of design cells in the design model to form a populated design model; map the populated design model to create a populated geologic model in the physical space based on the displacement map, wherein the populated geologic model includes the mesh, the plurality of cells, and assigned values of material properties; and store or display the populated geologic model, which may be used for hydrocarbon operations associated with the subsurface region.

Further, the set of instructions may also be configured to: solve a diffusion equation to establish a correspondence between points on the corresponding fault surfaces; solve only on the fault surfaces with surface parameterization values specified as boundary conditions; and/or solve a diffusion equation for the parameterization, which may be Poisson's equation. Also, the mesh is a tessellated mesh and the set of instructions may be configured to generate the tessellated mesh in the geologic model by dividing the physical domain into the plurality of cells, wherein the generated tessellated mesh may be cut or non-conforming across discontinuities and the plurality of cells in the generated tessellated mesh may have edges that do not cross horizon or fault surfaces.

In addition, the set of instructions may be configured to: strip the mesh on the corresponding fault surface; assign values as boundary conditions to nodes associated with corresponding fault surfaces on different horizons, wherein the nodes on the same horizon have the same assigned values; calculate a first set of surface parameterization values for the corresponding fault surfaces based on the assigned values; calculate a second set of surface parameterization values for the corresponding fault surfaces; and determine the parameterized nodes on the corresponding fault surfaces based on the first set of surface parameterization values and the second set of surface parameterization values.

Moreover, the set of instructions may be configured to solve an objective function that measures the energy caused by deformation and nodal slips; and solve the objective function comprises computing the equation:

$$\mathcal{P} = \sum_{i=1}^{N_c} \frac{1}{2} \int E \cdot S(E) d\Omega_i^e + \sum_{i=1}^{N_f} \frac{1}{2} K \| (x_i + u_i) - (x_i^c + u_i^c) \|^2$$

where the first term represents the deformation energy (e.g., summed over $N_e$) and the second term arises from the nodal slips summed over $N_f$; $N_e$ is the number of volumetric elements, E is the strain tensor which is approximated as a function of nodal slips; S(E) is the stress tensor and is a function of E; $\Omega_i^e$ is the physical domain occupied by the element i; $N_f$ is the number of nodes on the fault surfaces; K is a penalty parameter employed to penalize nodal slips; x denotes nodal coordinates; $x_i^c$ and $u_i^c$ denote the location and displacement, respectively, at the corresponding location on the other side of the fault; and denotes displacement vector at the node i.

In addition, the set of instructions may be configured to: solve a steady-state conservation law of linear momentum equation and the steady-state conservation law of linear momentum equation is:

$$\nabla \cdot S + f_b = 0$$

where S is the stress tensor and $f_b$ is the body force.

It should be understood that the preceding is merely a detailed description of specific embodiments of the invention and that numerous changes, modifications, and alternatives to the disclosed embodiments can be made in accordance with the disclosure here without departing from the scope of the invention. The preceding description, therefore, is not meant to limit the scope of the invention. Rather, the scope of the invention is to be determined only by the appended claims and their equivalents. It is also contemplated that structures and features embodied in the present examples can be altered, rearranged, substituted, deleted, duplicated, combined, or added to each other.

The foregoing description is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined by the appended claims.

The invention claimed is:

1. A method for generating a geologic model having one or more material properties for a faulted subsurface region comprising:
    (a) obtaining a geologic model in physical space representing a subsurface region, wherein the subsurface region includes one or more faults and one or more horizons, wherein the geologic model includes a mesh that includes a plurality of nodes and forms a plurality of cells and each of the one or more faults has corresponding fault surfaces;
    (b) parameterizing each of the corresponding fault surfaces of the one or more faults, wherein parameterizing each of the corresponding fault surfaces of the one or more faults comprises solving a diffusion equation to establish a correspondence between points on the corresponding fault surfaces;
    (c) solving one of an energy optimization equation and conservation law equation for the corresponding fault surfaces based on parameterized nodes on the fault surfaces to reduce or minimize nodal slips across the faults and to generate a displacement map, wherein the displacement map relates points between the physical space and a design spaces;
    (d) mapping the geologic model in the physical space to create a design model in the design space based on the displacement map, wherein the design model forms a unfaulted volume that includes the one or more horizons from the geologic model in the physical space and the design model includes an updated mesh that forms a design domain;
    (e) assigning values of one or more material properties in the design domain to form a populated design model;
    (f) mapping the populated design model to create a populated geologic model in the physical space based on the displacement map, wherein the populated geologic model includes the mesh, the plurality of cells, and assigned values of material properties; and
    (g) using the populated geologic model for hydrocarbon operations associated with the sub surface region.

2. The method of claim 1, wherein parameterizing each of the corresponding fault surfaces of the one or more faults comprises solving only on the fault surfaces with surface parameterization values specified as boundary conditions.

3. The method of claim 1, wherein solving one of an energy optimization equation and conservation law equation comprises solving an objective function that measures the energy caused by deformation and nodal slips.

4. The method of claim 3, wherein solving the objective function comprises computing the equation:

$$\mathcal{P} = \sum_{i=1}^{N_c} \frac{1}{2} \int E \cdot S(E) d\Omega_i^e + \sum_{i=1}^{N_f} \frac{1}{2} K \|(x_i + u_i) - (x_i^c + u_i^c)\|^2$$

where the first term represents the deformation energy (e.g., summed over $N_e$) and the second term arises from the nodal slips summed over $N_f$; $N_e$ is the number of volumetric elements, E is the strain tensor which is approximated as a function of nodal slips; S(E) is the stress tensor and is a function of E; $\Omega_i^e$ is the physical domain occupied by the element i; $N_f$ is the number of nodes on the fault surfaces; K is a penalty parameter employed to penalize nodal slips; x denotes nodal coordinates; $x_i^c$ and $u_i^c$ denote the location and displacement, respectively, at the corresponding location on the other side of the fault; and $u_i$ denotes displacement vector at the node i.

5. The method of claim 1, wherein solving one of an energy optimization equation and conservation law equation comprises solving a steady-state conservation law of linear momentum equation.

6. The method of claim 5, wherein the steady-state conservation law of linear momentum equation is:

$$\nabla \cdot S + f_b = 0$$

where S is the stress tensor and $f_b$ is the body force.

7. The method of claim 4, further comprising adding location dependent in-situ stresses to the stress tensor in the equation to reverse the effect of compaction on layer shape and layer thickness.

8. The method of claim 1, wherein the mesh is a tessellated mesh and further comprising generating the tessellated mesh in the geologic model by dividing the physical domain into the plurality of cells.

9. The method of claim 8, wherein the generated tessellated mesh is cut or non-conforming across discontinuities.

10. The method of claim 8, wherein the plurality of cells in the generated tessellated mesh have edges that do not cross horizon or fault surfaces.

11. The method of claim 1, wherein the diffusion equation is Poisson's equation.

12. The method of claim 1, wherein the parameterizing each of the corresponding fault surfaces of the one or more faults further comprises:
    stripping the mesh on the corresponding fault surface;
    assigning values as boundary conditions to nodes associated with corresponding fault surfaces on different horizons, wherein the nodes on the same horizon have the same assigned values;
    calculating a first set of surface parameterization values for the corresponding fault surfaces based on the assigned values;
    calculating a second set of surface parameterization values for the corresponding fault surfaces; and
    determining the parameterized nodes on the corresponding fault surfaces based on the first set of surface parameterization values and the second set of surface parameterization values.

13. The method of claim 1, wherein the one or more material properties comprise one or more of permeability and porosity.

14. A system for generating a geologic model having one or more material properties for a faulted subsurface region, comprising:
    a processor;
    an input device in communication with the processor and configured to receive input data associated with a subsurface region;
    memory in communication with the processor, the memory having a set of instructions, wherein the set of instructions, when executed, are configured to:
        obtain a geologic model in physical space representing a subsurface region, wherein the subsurface region includes one or more faults and one or more horizons, wherein the geologic model includes a mesh that includes a plurality of nodes and forms a plurality of cells and each of the one or more faults has corresponding fault surfaces;
        parameterize each of the corresponding fault surfaces of the one or more faults, wherein parameterizing each of the corresponding fault surfaces of the one or more faults comprises solving a diffusion equation to establish a correspondence between points on the corresponding fault surfaces;

solve one of an energy optimization equation and conservation law equation for the corresponding fault surfaces based on parameterized nodes on the fault surfaces to reduce or minimize nodal slips across the faults and to generate a displacement map, wherein the displacement map relates points between the physical space and a design spaces;

map the geologic model in the physical space to create a design model in the design space based on the displacement map, wherein the design model forms a unfaulted volume that includes the one or more horizons from the geologic model in the physical space and the design model includes an updated mesh that forms the design domain;

assign values of one or more material properties in the design model to form a populated design model;

map the populated design model to create a populated geologic model in the physical space based on the displacement map, wherein the populated geologic model includes the mesh, the plurality of cells, and assigned values of material properties; and store the populated geologic model in memory.

15. The system of claim 14, wherein the set of instructions, when executed, are further configured to: solve only on the fault surfaces with surface parameterization values specified as boundary conditions.

16. The system of claim 14, wherein the set of instructions, when executed, are further configured to: solve an objective function that measures the energy caused by deformation and nodal slips, wherein the objective function is:

$$\mathcal{P} = \sum_{i=1}^{N_c} \frac{1}{2} \int E \cdot S(E) d\Omega_i^e + \sum_{i=1}^{N_f} \frac{1}{2} K \|(x_i + u_i) - (x_i^c + u_i^c)\|^2$$

where the first term represents the deformation energy (e.g., summed over $N_e$) and the second term arises from the nodal slips summed over $N_f$, $N_e$ is the number of volumetric elements, E is the strain tensor which is approximated as a function of nodal slips; S(E) is the stress tensor and is a function of E; $\Omega_i^e$ is the physical domain occupied by the element i; $N_f$ is the number of nodes on the fault surfaces; K is a penalty parameter employed to penalize nodal slips; x denotes nodal coordinates; $x_i^c$ and $u_i^c$ denote the location and displacement, respectively, at the corresponding location on the other side of the fault; and $u_i$ denotes displacement vector at the node i.

17. The system of claim 14, wherein the set of instructions, when executed, are further configured to: solve a steady-state conservation law of linear momentum equation, wherein the steady-state conservation law of linear momentum equation is:

$$\nabla \cdot S + f_b = 0$$

where S is the stress tensor and $f_b$ is the body force.

18. The system of claim 14, wherein the set of instructions, when executed, are further configured to: generate a tessellated mesh in the geologic model by dividing the physical domain into the plurality of cells, wherein the generated tessellated mesh is cut or non-conforming across discontinuities.

19. The system of claim 14, wherein the set of instructions, when executed, are further configured to:

strip the mesh on the corresponding fault surface;

assign values as boundary conditions to nodes associated with corresponding fault surfaces on different horizons, wherein the nodes on the same horizon have the same assigned values;

calculate a first set of surface parameterization values for the corresponding fault surfaces based on the assigned values;

calculate a second set of surface parameterization values for the corresponding fault surfaces; and determine the parameterized nodes on the corresponding fault surfaces based on the first set of surface parameterization values and the second set of surface parameterization values.

20. The method of claim 1 further comprising outputting the populated geologic model.

21. The method of claim 1, wherein using the populated geologic model for hydrocarbon operations associated with the subsurface region comprises using the populated geologic model to estimate or adjust reserves forecasts or to modify or adjust drilling operations.

* * * * *